United States Patent [19]

Anneser

[11] Patent Number: 5,550,412
[45] Date of Patent: Aug. 27, 1996

[54] ISOLATED MOSFET GATE DRIVE

[75] Inventor: Douglas L. Anneser, Hollis, N.H.

[73] Assignee: United Technologies Corporation, Hartford, Conn.

[21] Appl. No.: 304,537

[22] Filed: Sep. 12, 1994

[51] Int. Cl.⁶ .................................................. H01H 47/00
[52] U.S. Cl. ............................. 307/125; 307/113; 327/427
[58] Field of Search ............................. 327/427, 432, 327/110, 108; 307/112, 113, 116, 125, 130, 131; 323/265, 282, 349

[56] References Cited

U.S. PATENT DOCUMENTS

| | | | |
|---|---|---|---|
| 4,423,341 | 12/1983 | Shelly | 327/112 |
| 4,461,966 | 7/1984 | Hebenstreit | 327/432 |
| 4,511,815 | 4/1985 | Wood | 327/436 |
| 4,967,101 | 10/1990 | Nakamura et al. | 327/109 |
| 5,019,719 | 5/1991 | King | 327/110 |
| 5,055,722 | 10/1991 | Latos et al. | 327/379 |
| 5,304,863 | 4/1994 | Cargille | 327/110 |
| 5,422,587 | 6/1995 | Pulvirenti et al. | 327/427 |

*Primary Examiner*—William M. Shoop, Jr.
*Assistant Examiner*—Jonathan S. Kaplan
*Attorney, Agent, or Firm*—Richard H. Kosakowski, Esq.; Holland & Bonzagni, P.C.

[57] ABSTRACT

A transformer-based electrical circuit that isolates a low voltage level input control signal from a power switching device, such a MOSFET, is disclosed. The circuit includes a pair of complementary dual bipolar transistor configurations connected to the secondary winding of a pulse transformer. The low voltage input signal is connected to the primary winding of the transformer. A pair of resistor network transistor drivers connect to corresponding bipolar transistors, whose outputs connect to the gate terminal of the MOSFET. The drivers are also connected to the complementary transistor pairs. A resistive feedback network is connected between the gate terminal of the MOSFET and the complimentary transistor pairs. The feedback network latches the selected drive voltage to the gate of the MOSFET, thereby keeping it on or off irrespective of the fact that the pulse transformer may have saturated.

17 Claims, 2 Drawing Sheets

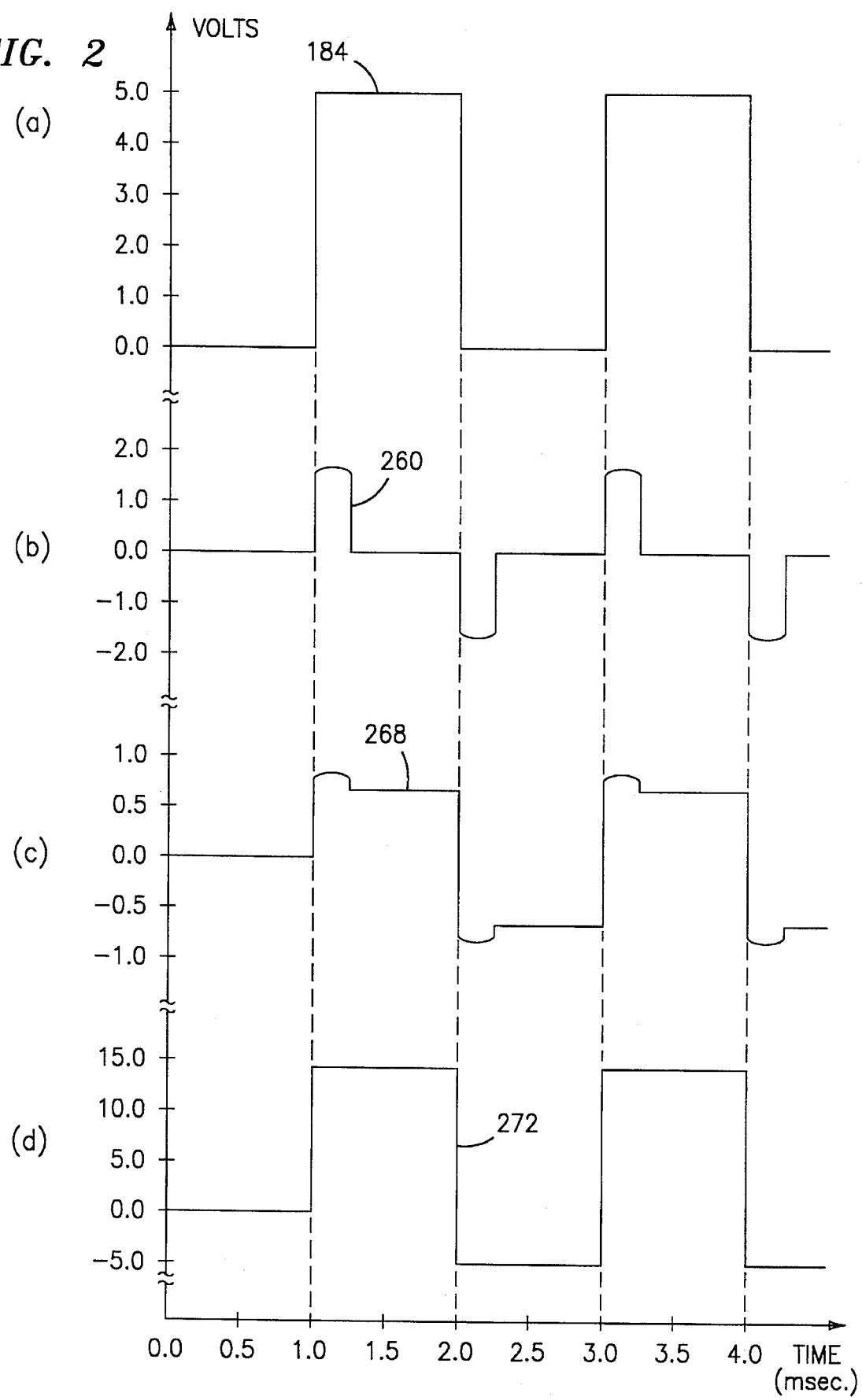

ISOLATED MOSFET GATE DRIVE

The United States Government has rights in this invention pursuant to contract No. F33615-92-C-2275, awarded by the Department of the Air Force.

BACKGROUND OF THE INVENTION

This invention relates to drive circuits for a power MOSFET switching transistor, and more particularly to a transformer-based isolation drive circuit for such a power MOSFET.

High-power transistors, such as MOSFETs ("Metal Oxide Semiconductor Field Effect Transistors"), are commonly used as switching devices to apply a relatively large electrical current and/or voltage to a load. The load, for example, may be part of a motor or power supply. The MOSFET is a voltage-controlled device having an input gate terminal that controls the bistable output switching states of the device. The bistable output states comprise a conductive or "ON" state, and a non-conductive or "OFF" state. The gate can be controlled by a bistable voltage signal that is of relatively much lower voltage than the switched voltage at the MOSFET output, due in part to the high impedance associated with the gate circuit of the MOSFET. Certain applications of MOSFET drive circuits require DC isolation between the load and the control signals used to drive the MOSFET gate.

One known way of DC isolation involves the use of transformers. The transformer provides the requisite complete DC isolation, along with impedance matching and voltage step-up or step-down ability. However, transformer isolation is inherently limited by the constant volts/seconds property of the transformer. That is, when used to transmit alternating voltage waveforms that have both positive and negative excursions, the core flux of the transformer must be reset after application of positive voltage by applying a negative voltage, and vice versa. The product of the magnitude (volts) and duration (seconds) of each voltage polarity must be equal. Otherwise, residual flux will accumulate in the transformer core. This inherent limitation on transformer performance has typically limited transformer drivers to duty cycles for the control signal of approximately fifty percent. Some examples of prior art transformer isolation circuits, including those which purport to provide for a large duty cycle, are given in U.S. Pat. Nos. 4,423,341, 4,461,966, 4,511,815, 4,967,101, 5,055,722, and 5,304,863.

It is also known to use an optocoupler to electrically isolate the input control signal from the power switching device. In such a scheme, no transformer is utilized, which usually allows for a wide variation in the duty cycle of the input signal. However, an optocoupler scheme requires conversion of the input control signal from electrical to optical energy and back. This leads to inherent circuit complexities and inefficiencies, and degradation of optocoupler performance over time.

Accordingly, it is a primary object of the present invention to provide a drive circuit for a power switching device in that the drive circuit uses a transformer to isolate the low voltage level control signal from the relatively high power switching device.

It is a general object of the present invention to provide a drive circuit that allows a low voltage, bistable-state switching signal to control the bistable switching states of a relatively high powered switching device, such as a MOSFET.

It is another object of the present invention to provide a transformer-based isolation circuit that allows for a wide variation in the duty cycle of the input control signal.

It is still another object of the present invention to provide a transformer-based isolation circuit that has inherent voltage clamping or latching of the voltage control terminal of the power switching device (e.g., the gate terminal of a MOSFET), thereby making the voltage at the output of the MOSFET independent of the saturation of the transformer.

The above and other objects and advantages of this invention will become more readily apparent when the following description is read in conjunction with the accompanying drawings.

SUMMARY OF THE INVENTION

To overcome the deficiencies of the prior art and to achieve the objects listed above, the Applicant has invented an improved transformer-based isolation circuit that electrically interfaces a low voltage control signal and a power switching device, such as a MOSFET.

In a preferred embodiment, a low voltage bistable signal is applied across the primary winding of a pulse transformer. The output stage of the circuit is a MOSFET whose drain terminal is connected to a source of high voltage (e.g., 270 volts DC), and whose source terminal is the output of the circuit connected to a load, such as the coil of a motor. The DC voltage level of the gate terminal relative to the source terminal of the MOSFET controls the switching of the MOSFET between its conductive ("ON") and non-conductive ("OFF") states. Disposed between the secondary winding of the transformer and the gate terminal of the MOSFET is the circuit of the present invention.

The circuit includes a pair of complimentary dual bipolar transistor configurations that function as current mirrors and comparators. Certain emitters of the complimentary transistor pairs connect to the secondary winding of the transformer. Certain collector terminals of the complimentary transistor pairs connect to corresponding resistor networks that form part of transistor drivers. The drivers switch a corresponding positive or negative DC voltage to the gate of the MOSFET to turn the MOSFET on or off, respectively. A feedback network comprised of resistors and a zener diode connects between the gate of the MOSFET and the bases of the transistors in the complimentary transistor pairs. The network is used to latch the selected drive voltage to the gate of the MOSFET, thereby keeping it on or off irrespective of the saturation of the transformer and the subsequent collapse (i.e., return to zero) of the voltage across the secondary winding of the transformer.

BRIEF DESCRIPTION OF THE DRAWINGS

FIG. 2 illustrates voltage waveforms at various points or nodes in the circuit of FIG. 1 during operation thereof.

DETAILED DESCRIPTION OF THE PREFERRED EMBODIMENTS

Figure 1:
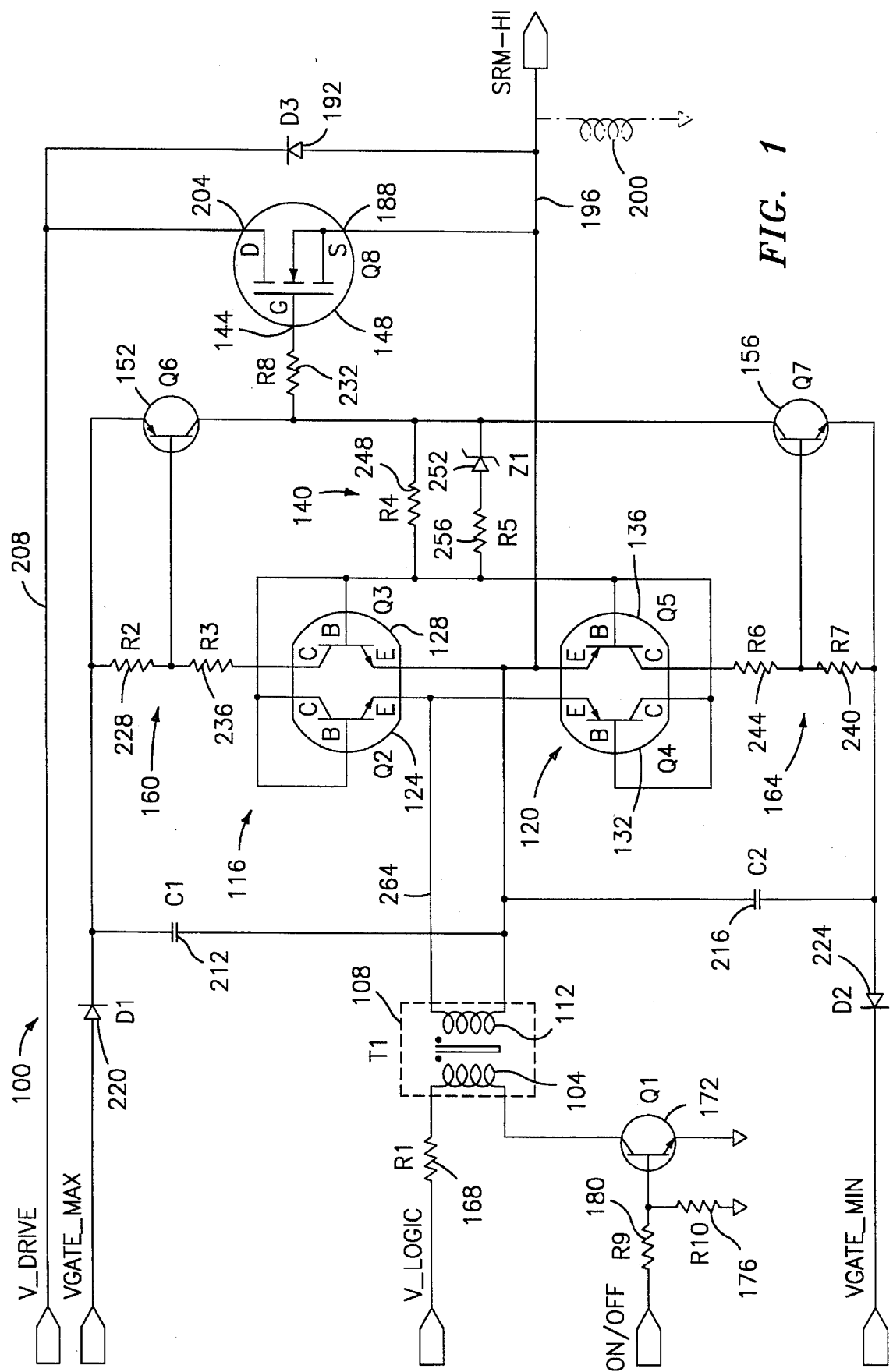
FIG. 1 is a schematic illustration of the circuit of the present invention used to isolate a low voltage control signal from a power switching device, such as a MOSFET.

Referring to the drawings in detail, a preferred embodiment for an electrical circuit that isolates a low voltage bistable control signal from a power switching device, such as a MOSFET, is illustrated in detail and generally designated by the reference numeral 100. The low voltage signal is applied to a primary winding 104 of a pulse transformer 108. A secondary winding 112 of the transformer 108 is connected to a pair of complimentary dual bipolar transistor configurations 116, 120 that function as current mirrors and comparators. One complimentary transistor configuration 116 comprises a pair of NPN transistors 124, 128, while a second configuration 120 comprises a pair of PNP transistors 132, 136. The bases of all four transistors 124–136 in the configurations are connected together and also to a feedback network 140, the other side of which is connected to the gate 144 of the MOSFET 148. Also connected to the gate 144 of the MOSFET 148 are the collector terminals of a pair of driver transistors 152, 156. These transistors 152, 156 switch a corresponding positive or negative voltage, respectively, to the gate 144 of the MOSFET 148, thereby turning the MOSFET 148 on or off accordingly. Each driver transistor 152, 156 has a resistor divider network 160, 164 connected between the appropriate voltage supply and a corresponding collector terminal of a transistor within an associated complimentary transistor pair 116, 120.

Referring to the detailed schematic illustration of FIG. 1 of the isolation circuit 100 of the present invention, positive five volts DC ("+5 VDC") is provided as a signal, V_LOGIC, through a resistor, R1 168, to one side of a primary winding 104 of a pulse transformer, T1 108. The lower side of the primary winding 104 of the transformer 108 connects to the collector terminal of an NPN switching transistor, Q1 172. The transistor 172 may comprise the commercially available Model 2N2222A. The base of the transistor, Q1 172, is connected through a resistor, R10 176, to ground. The base of the transistor, Q1 172, also connects through a resistor, R9 180, to a bistable low voltage signal, ON/OFF*. This signal ON/OFF* is illustrated in the waveform 184 of FIG. 2(a), and functions as the low voltage (i.e., zero to five volts DC) control signal that ultimately controls the switching output state of the MOSFET 148.

The transformer 108, which may comprise any one of a number of commercially-available models, has a secondary winding 112. The top end of this secondary winding 112 is connected to the emitter terminals of transistors Q2 124 and Q4 132. Transistor Q2 124 is connected in a current mirror configuration with transistor Q3 128, while transistor Q4 132 is connected in a current mirror configuration with transistor Q5 136. Both transistors Q2 124 and Q3 128 are NPN transistors that may comprise the Model 2N2920, available in a single package. In a similar manner, transistors Q4 132 and Q5 136 are both of the PNP type, and may comprise the Model 2N3810, typically available in a single package. The base of transistor Q4 132 is connected to the collector of Q4 132 and also to the base of transistor Q5 136. Further, the base of transistor Q2 124 connects to the collector of transistor Q2 124, to the base of transistor Q3 128, and to the base of transistor Q5 136.

The low side of the secondary winding 112 of the transformer, T1 108, connects to the emitter terminal of transistor Q3 128 and also to the emitter terminal of transistor Q5 136. The low side of the secondary winding 112 of the transformer 108 also connects to the source terminal 188 of the MOSFET Q8 148 and to the anode of a diode, D3 192. The diode, D3 192, may comprise the commercially-available 1N5617. This signal on the line 196 represents the output signal of the circuit of the present invention. As such, it is also connected to a load 200, illustrated in phantom as a coil of a motor. This output signal 196 is labeled SRM_HI.

The drain terminal 204 of the MOSFET 148, together with the cathode of diode D3 192, connects to a source of high voltage provided on a line 208 and labeled as V_DRIVE. In a preferred embodiment of the present invention, V_DRIVE is approximately 270 volts DC. Thus, with the MOSFET 148 in a conductive or "ON" state, 270 volts DC is switched onto the line SRM_HI 196 and applied to the load 200. Conversely, when the MOSFET 148 is in a non-conductive or "OFF" state, zero voltage is applied across the load 200.

The low side of the secondary winding 112 of the transformer T1 108 also connects to one side of each of a pair of capacitors C1 212 and C2 216. The other side of capacitor C1 212 connects to the cathode of a diode, D1 220. The anode of the diode D1 220 connects to a positive 15 volts DC ("+15 VDC") supply voltage, that comprises a signal labeled VGATE_MAX. Diode D1 220 may comprise the commercially available Model 1N5617. Capacitor C1 212 may comprise a commercially available capacitor having an exemplary value of 100 microfarads ("uF").

The other side of capacitor C2 216 connects to the anode of a diode, D2 224, while the cathode of the diode D2 224 connects to a voltage source, labeled VGATE_MIN, that equals +265 VDC in an exemplary embodiment. Diode D2 224 may also comprise the Model 1N5617, while capacitor C2 216 may also comprise a 100 uf, commercially available capacitor. As illustrated hereinafter in greater detail in conjunction with an operating example of the circuit of the present invention, D1 220 and C1 212, and D2 224 and C2 216 each supply an independent "over-rail" gate voltage to the MOSFET 148 using a "bootstrap" principle.

The cathode of diode D1 220 also connects to a resistor R2 228, and to the emitter terminal of a transistor Q6 152. The transistor Q6 152 may comprise the commercially available Model 2N2907A, PNP-type transistor. The collector terminal of the transistor Q6 152 connects through a resistor, R8 232, to the gate terminal 144 of the MOSFET 148. The base of the transistor Q6 152 connects to the other side of the resistor R2 228, and also to one side of a resistor R3 236. The other side of the resistor R3 236 connects to the collector terminal of the transistor Q3 128.

The anode of diode, D2 224, connects to one side of the resistor R7 240 and also to the emitter terminal of a transistor Q7 156. The transistor Q7 156 may comprise the Model 2N2222A, NPN-type transistor. The collector terminal of transistor, Q7 156, also connects to the gate 144 of the MOSFET 148 through the resistor R8 232. The base of the transistor, Q7 156, connects to the other side of the resistor R7 240, and also to one side of a resistor R6 244. The other side of the resistor, R6 244, connects to the collector terminal of the transistor Q5 136. The collector terminals of transistors, Q6 152 and Q7 156, also connect to one side of a resistor, R4 248, and the cathode of a zener diode Z1 252. The other side of the resistor, R4 248, connects to the bases of the transistors, Q2–Q5 124–136, and also to one side of a resistor R5 256. The other side of the resistor, R5 256, connects to the anode terminal of the zener diode, Z1 252. The zener diode 252 may comprise the commercially-available Model 1N972A. The resistors R1–R10, along with their values in ohms, are cross-referenced to FIG. 1 by Table I as follows:

TABLE I

| Ref. No. | Resistor No. | Resistance Value (ohms) |
|---|---|---|
| 168 | R1 | 1K |
| 228 | R2 | 10K |
| 236 | R3 | 10K |
| 248 | R4 | 20K |

TABLE I-continued

| Ref. No. | Resistor No. | Resistance Value (ohms) |
| --- | --- | --- |
| 256 | R5 | 8.2K |
| 244 | R6 | 10K |
| 240 | R7 | 10K |
| 232 | R8 | 100 |
| 180 | R9 | 10K |
| 176 | R10 | 10K |

The operation of the circuit 100 of present invention is best understood by example. Initially, assume that there is zero volts applied across the primary winding 104 of the transformer 108. Thus, there is also zero volts applied across the secondary 112 of the transformer 108. This situation is illustrated in the waveforms of FIG. 2 at time T=0. The waveform of FIG. 2(a) 184 illustrates the low voltage control signal ON/OFF*. The waveform 260 of FIG. 2(b) illustrates the voltage on the line 264 at the upper side of the secondary winding 112 of the transformer 108. The waveform 268 of FIG. 2(c) illustrates the voltage on the base terminals of the four transistors, Q2–Q5 124–136. Finally, the waveform 272 of FIG. 2(d) illustrates the voltage at the connection of the collectors of transistors Q6 152 and Q7 156. It should be noted that the voltage values of the waveforms of FIGS. 2(b), 2(c) and 2(d) are all illustrated as being relative to the signal SRM_HI on the line 196. That is, 0.0 VDC in each of these three waveforms equals the voltage value of SRM_HI, and is not taken to mean an absolute voltage value of 0.0 VDC.

For this initial condition, assume that the gate terminal 144 of the MOSFET 148 is approximately equal to zero volts DC, instead of −5 volts as in FIG. 2(d) (i.e., is equal to the difference of V_DRIVE and VGATE_MIN), and that the MOSFET 148 is in its "OFF" state. That is, V_DRIVE equals +270 VDC and VGATE_MIN equals +265 VDC in this embodiment. Thus, there is zero volts connected across the load 200. In this case, the emitters of the four transistors, Q2–Q5 124–136, are all at approximately the same voltage (zero volts) because the impedance of the secondary 112 of the transformer, T1 108, is approximately zero. That is, there is no voltage drop across the secondary 112 of the transformer 108, as illustrated in FIG. 2(b), at time T=0.

Referring to the waveforms of FIG. 2, at time T=1 millisecond ("msec"), the low voltage control signal, ON/OFF*, switches from zero volts to approximately five volts DC. This causes transistor, Q1 172, to turn on and saturate as a switch, thereby switching ground to the lower side of the primary winding 104 of the transformer, T1 108. The current in the primary winding 104 is limited by the resistor R1 168. The resulting secondary winding current forward biases two P-N junctions. This voltage is commonly referred to as $V_{be}$ and has a value of approximately 0.8 volts. This voltage of approximately two times $V_{be}$ appears across the secondary winding 112 of the transformer, T1 108, for a period of only approximately 0.25 milliseconds. The reason that the voltage across the secondary 112 lasts for a relatively short duration is that the core of the transformer 108 quickly saturates, and, thus, the voltage across the secondary winding 112 of the transformer 108 drops back to approximately zero volts. Therefore, the transformer, T1 108, couples the control voltage signal, ON/OFF into a current pulse on the secondary winding 112.

However, for the relatively short time period (i.e., 0.25 milliseconds) that a voltage appears across the secondary winding 112 of the transformer 108, an electrical current flows into the node at the connection of the emitter terminals of transistors Q2 124 and Q4 132. This current pulse, which is sensed by the transistors Q2 124 and Q4 132 acting as comparators, causes the corresponding voltage at all of the bases of the transistors, Q2–Q5 124–136, to increase. That is, transistor Q4 132 has its emitter/base junction forward biased, thereby acting as a voltage clamp diode to pull up the base voltage for all of the transistors, Q2–Q5 124–136. This is illustrated in the waveform of FIG. 2(c) 268 at time T=1.0 milliseconds, wherein the voltage increases from approximately 0.0 volts to $V_{be}$ (i.e., 0.8 VDC). That is, during the time period from T=1.0 milliseconds to T=1.25 milliseconds, Q3 128 is saturated, as indicated by its base voltage of 0.8 VDC (FIG. 2(c)). Then, during that time period from T=1.25 milliseconds to T=2.0 milliseconds, Q2 124 and Q3 128 function as a current mirror, and the voltage on the base terminals of both Q2 124 and Q3 128 drops to 0.7 VDC and remains there during this time period.

At time T=1.0 milliseconds, as the base voltage on Q2–Q5 124–136 increases, the transistors Q5 136 and Q7 156 turn off and transistor Q3 128 turns on. As transistor Q3 turns on, it supplies a bias current for the transistor Q6 152, thereby turning it on. Transistor Q6 152 is also biased through the resistor network 160 comprised of resistors R2 228 and R3 236. The transistor Q6 152 saturates and acts as a switch to drive the gate voltage of the MOSFET, Q8 148, to that of approximately the value of the voltage across the capacitor C1 212, which equals the voltage value of VGATE_MAX (i.e., +15 VDC) minus 0.7 VDC, which is the voltage drop across the diode D1 220. The collector terminal of the transistor, Q6 152, applies this voltage to the gate 144 of the MOSFET 148, thereby turning it on to enable it to switch the relatively higher voltage of V_DRIVE across the load 200 on the signal line SRM_HI 196. This situation is illustrated in FIG. 2(d) at time T=1.0 milliseconds.

At time T=1.0 milliseconds, as transistor Q3 128 turns on, transistor Q2 124 is reversed biased. Then, after approximately 0.25 milliseconds, the transformer core becomes saturated and the impedance, and thus the voltage across the secondary winding 112 of the transformer 108, both return to zero. The transistor Q2 124 then becomes forward biased. The configuration of transistors Q2 124 and Q3 128 is now that of a current mirror, wherein the collector current of the transistor Q3 128 is determined by the value of the resistor R4 248. This resistor R4 248 biases or "latches" the bases of the transistors, Q2 124 and Q3 128, thereby insuring that the MOSFET 148 remains in its "ON" or conductive state, regardless of the fact that the transformer core has saturated.

At time T=2.0 milliseconds, the waveform 184 ON/OFF* switches from +5 VDC to 0 VDC. This causes the voltage across the secondary winding 112 to "pulse" from 0 VDC to −2 times $V_{be}$. The transistors Q3 128 and Q5 136 act as comparators and sense this pulse, turning on transistor Q5 136 and turning off transistor Q3 128. The bases of all of the transistors Q2–Q5 124–136 transition to −1 $V_{be}$ at time T=2.0 milliseconds. After approximately 0.25 milliseconds, the currents in both the transformer primary and secondary windings 104, 112 return to zero. However, at this time, the zener diode, Z1 252, is forward biased like a normal diode through the resistor R5 256. The dual PNP pair 120 of transistors, Q4 132 and Q5 136, are now configured as a current mirror and they are biased in the forward linear region with the current in each transistor being determined by the value of the resistor R5 256. The collector current of the transistor, Q5 136, has caused the transistor, Q7 156, to turn on at time T=2.0 milliseconds and saturate as a switch. The resulting collector current of the transistor, Q7 156, provides the bias voltage for the zener diode, Z1 252. This causes the voltage on the gate 144 of the MOSFET, Q8 148, to remain at the value of the voltage across capacitor C2 216 (i.e., −5 volts DC). Thus, the feedback connection of the zener diode, Z1 252, and the resistor R5 256, ensures that the MOSFET 148 remains in its "OFF" state even after the currents in both the transformer primary and secondary windings 104, 112 return to zero.

Thus, it can be seen from the waveforms of FIG. 2 that the voltage on the collector terminals of the transistors, Q6 152 and Q7 156, "follow" or are controlled by the switching of the low voltage control signal, ON/OFF*, illustrated by the waveform 184 in FIG. 2(a). In other words, the transistors Q3 128, Q5 136, Q6 152, Q7 156, and the MOSFET, Q8 148, are all "edge triggered" by the rising and falling edges of the control signal, ON/OFF*. When the transistor Q6 152 is "ON" the resistor, R4 248, feeds back a voltage to keep transistor Q3 128 on, thereby insuring that the MOSFET 148 stays turned on for the entire duration of the low voltage control signal, ON/OFF*, being also turned on. Alternatively, when the transistor, Q7 156, is turned on, a combination of the zener diode Z1 252, and the resistor, R5 256, feed back a voltage to keep transistor Q5 136 turned on, thereby ensuring that the gate terminal 144, and thus the MOSFET 148 is turned off for the entire duration that the low voltage control signal, ON/OFF*, is also at its low binary logic level state.

The waveform 184 of FIG. 2(a) of the low voltage control signal, ON/OFF*, has been illustrated as comprising a symmetrical signal (that is, having equal "ON" and "OFF" times, or a fifty percent duty cycle). However, this is purely exemplary. As a practical matter, the low voltage control signal could have a duty cycle that ranges anywhere from zero to one hundred percent (with respect to its "ON" time, or the amount of time that the signal spends at approximately its "high" logic level of +5 VDC). However, due to the usage of the two bootstrap circuits consisting of diode D1 220 and capacitor C1 212, and diode D2 224 and capacitor C2 216, respectively, the capacitors C1 212 and C2 216 must be periodically charged by application of the ON/OFF* signal having its high logic level of +5 VDC asserted for a certain length of time as determined by the value of the capacitors chosen.

It should be understood from the foregoing that the voltage values described hereinbefore are purely exemplary; other voltage values may be chosen without departing from the broadest scope of the present invention. Further, the present invention has been described with a particular type of power switching transistor; that is, a MOSFET 148. However, other power switching devices may be utilized without departing from the broadest scope of the present invention.

Also, the present invention has been described for use in controlling the application of a voltage to one side of a load 200. However, two or more similar circuits may be arranged to apply a voltage or current to both sides of a load. For example, one circuit may be connected to the high side of the load, and a second circuit may be connected to the low side of the same load. Alternatively, an "H"-bridge configuration may be realized with four similar circuits. One pair of circuits are arranged and controlled to pass current in one direction through the load, while a second pair of circuits are arranged and controlled to pass current in the opposite direction through the load.

It should be understood by those skilled in the art that obvious structural modifications can be made without departing from the spirit of the invention. Accordingly, reference should be made primarily to the accompanying claims, rather than the foregoing specification, to determine the scope of the invention.

Having thus described the invention, what is claimed is:

1. Apparatus for interfacing a power switching device with a control signal having a plurality of states, the apparatus comprising:
   a. a transformer having a primary winding, the states of the control signal being applied as corresponding voltages across the primary winding, the transformer having a secondary winding;
   b. sensing means for sensing a current on the secondary winding of the transformer; and
   c. control means, responsive to the means for sensing, for controlling the power switching device between an on state where the power switching device is electrically conductive between a pair of output terminals of the power switching device and an off state where the power switching is nonelectrically conductive between the pair of output terminals of the power switching device, the control means further comprising feedback means for latching the sensing means in any of several predetermined states and for latching the power switching device in a corresponding any one of the on or off states, wherein a length of time that the power switching device is in the on or off states is proportional to a length of time that the control signal is at a corresponding one of the plurality of states.

2. The apparatus of claim 1, wherein the control means for controlling the power switching device comprises first switching means for switching a first voltage to a control terminal of the power switching device, and comprises second switching means for switching a second voltage to the control terminal of the power switching device.

3. The apparatus of claim 2, wherein the sensing means comprises means for controlling the first switching means in response to a first voltage level on the secondary winding of the transformer, and comprises means for controlling the second switching means in response to a second voltage level on the secondary winding of the transformer.

4. The apparatus of claim 3, wherein the sensing means comprises third and fourth switching means, the feedback means further comprises means for simultaneously latching the first and third switching means in one of the several predetermined states of the sensing means, and for simultaneously latching the second and fourth switching means in another one of the several predetermined states of the sensing means.

5. The apparatus of claim 4, wherein the third switching means comprises a first pair of transistors and wherein the first switching means comprises a first transistor, wherein the first pair of transistors is responsive to the first voltage level on the secondary winding of the transformer and to the feedback means for controlling a switching state of the first transistor.

6. The apparatus of claim 4, wherein the fourth switching means comprises a second pair of transistors and wherein the second switching means comprises a second transistor, wherein the second pair of transistors is responsive to the second voltage level on the secondary winding of the transformer and to the feedback means for controlling a switching state of the second transistor.

7. Apparatus, comprising:
   a. a transformer having a primary winding connected with a control signal having at least two logic states that correspond with two different voltage levels applied to the primary winding, the transformer also having a secondary winding;

b. a power switching device having a pair of output terminals and an input terminal, the power switching device being operable to be switched between a conductive on state in which the pair of output terminals are electrically connected together and a non-conductive off state in which the pair of output terminals are electrically disconnected, the power switching device being switched between the on and off states in accordance with a voltage level of a gate signal applied to the input terminal;

c. means for sensing a transition of the control signal between the two logic states of the control signal and for changing the voltage level of the gate signal in response to the transition of the control signal; and d. feedback means for latching the voltage level of the gate signal to a corresponding one of two predetermined values, the gate signal voltage level being latched at the time of the corresponding transition of the control signal and remaining at the latched value until the next transition of the control signal at which time the gate signal voltage level is latched at the other one of the two predetermined values.

8. The apparatus of claim 7, wherein the power switching device comprises a transistor.

9. The apparatus of claim 8, wherein the transistor comprises a field effect transistor, wherein the pair of output terminals comprise a source terminal and a drain terminal of the field effect transistor, and wherein the input terminal comprises a gate terminal of the field effect transistor.

10. Electrical circuitry, comprising:

a. a transformer having primary and secondary windings, a control signal having bistable states indicated by a pair of discrete voltage values being applied to the primary winding;

b. a power transistor having a pair of output terminals and an input control terminal, the power transistor being operable to be switched between two discrete output states depending on either one of two discrete logic levels of a gate signal applied to the input control terminal;

c. first switch means for providing a first supply voltage as the gate signal as a first one of the two gate signal logic levels;

d. second switch means for providing a second supply voltage as the gate signal as a second one of the two gate signal logic levels;

e. means, being responsive to any voltage change on the secondary winding of the transformer that corresponds to a simultaneous voltage change on the first winding of the transformer, for triggering the first switch means to provide the first supply voltage upon a voltage change on the primary winding of the transformer from a first voltage value to a second voltage value, and for triggering the second switch means to provide the second supply voltage upon a voltage change on the primary winding of the transformer from the second voltage value back to the first voltage value; and f. feedback means, connected to an output of both the first switch means and the second switch means, for sustaining the means for triggering the first switch means to provide the first supply voltage during an entire time that the control signal is at a first one of the discrete voltage values, and for sustaining the means for triggering the second switch means to provide the second supply voltage during an entire time that the control signal is at the second discrete voltage value.

11. The electrical circuitry of claim 10, wherein the power transistor comprises a field effect transistor, the pair of output terminals comprising a drain terminal and a source terminal of the field effect transistor, the input control terminal comprising a gate terminal of the field effect transistor.

12. The electrical circuitry of claim 10, wherein the first supply voltage is a positive voltage, the first switch means is a PNP bipolar transistor whose emitter terminal is connected to the first supply voltage and whose collector terminal has the first supply voltage electrically connected thereto when the PNP transistor is turned on.

13. The electrical circuitry of claim 12, wherein the second supply voltage is a negative voltage, the second switch means is a NPN bipolar transistor whose emitter terminal is connected to the second supply voltage and whose collector terminal has the second supply voltage electrically connected thereto when the NPN transistor is turned on.

14. The electrical circuitry of claim 13, wherein the means for triggering the first switch means and for triggering the second switch means comprises a pair of NPN bipolar transistors and a pair of PNP bipolar transistors, an emitter terminal of one of the pair of NPN transistors being connected to an emitter terminal of one of the pair of PNP transistors and also connected to a first side of the secondary winding of the transformer, an emitter terminal of a second one of the pair NPN transistors being connected to an emitter terminal of a second one of the pair of the PNP transistors and also being connected to a second side of the secondary winding of the transformer, a base terminal of each of the pair of NPN transistors being connected to a base terminal of each of the pair of the PNP transistors, a collector terminal of one of the pair of NPN transistors being connected with a base terminal of the PNP bipolar transistor that comprises the first switch means a collector terminal of one of the pair of PNP transistors being connected with a base terminal of the NPN transistor that comprises the second switch means.

15. The electrical circuitry of claim 14, wherein the feedback means is connected between the output of both the first switch means and the second switch means and to the base terminals of each of the pair of NPN transistors and each of the pair of PNP transistors.

16. The electrical circuitry of claim 15, wherein the feedback means comprises a first resistor operable to connect the first supply voltage to the base terminals of each of the pair of NPN transistors when the PNP bipolar transistor that comprises the first switch means is turned on.

17. The electrical circuitry of claim 16, wherein the feedback means further comprises a zener diode and a second resistor connected between the output of the second switch means and the base terminals of each of the pair of PNP transistors, and being operable to provide the second supply voltage to the base terminal of the NPN bipolar transistor when that transistor is turned on.

* * * * *